US011473192B2

(12) United States Patent
Zhong et al.

(10) Patent No.: US 11,473,192 B2
(45) Date of Patent: Oct. 18, 2022

(54) METHOD FOR OPENLY AND CONTINUOUSLY GROWING CARBON NANOMATERIALS

(71) Applicant: SHENZHEN NASO TECH CO., LTD., Shenzhen (CN)

(72) Inventors: Guofang Zhong, Shenzhen (CN); Can Zhang, Shenzhen (CN)

(73) Assignee: SHENZHEN NASO TECH CO., LTD., Shenzhen (CN)

( * ) Notice: Subject to any disclaimer, the term of this patent is extended or adjusted under 35 U.S.C. 154(b) by 0 days.

(21) Appl. No.: 17/285,132

(22) PCT Filed: Nov. 27, 2019

(86) PCT No.: PCT/CN2019/121124
§ 371 (c)(1),
(2) Date: Apr. 14, 2021

(87) PCT Pub. No.: WO2020/078480
PCT Pub. Date: Apr. 23, 2020

(65) Prior Publication Data
US 2021/0348268 A1    Nov. 11, 2021

(30) Foreign Application Priority Data

Oct. 19, 2018  (CN) .......................... 201811222119.8

(51) Int. Cl.
*C23C 16/26* (2006.01)
*C23C 16/02* (2006.01)
(Continued)

(52) U.S. Cl.
CPC .......... *C23C 16/26* (2013.01); *C23C 16/0227* (2013.01); *C23C 16/0254* (2013.01);
(Continued)

(58) Field of Classification Search
CPC . C23C 16/26; C23C 16/0227; C23C 16/0254; C23C 16/0272; C23C 16/52;
(Continued)

(56) References Cited

U.S. PATENT DOCUMENTS 7,183,228 B1 * 2/2007 Dai .......................... C30B 29/02
977/843
9,731,971 B2 * 8/2017 Cooper .................... C23C 16/26
(Continued)

FOREIGN PATENT DOCUMENTS

CN    102732834 A    10/2012
CN    102976318 B    4/2015
(Continued)

*Primary Examiner* — Brian K Talbot

(57) ABSTRACT

The invention discloses equipment and preparation method for open and continuous growth of a carbon nanomaterial. The equipment comprises a metal foil tape feeding system, a CVD system and a collection system. The method includes continuously conveying a metal foil tape pretreated or not into the CVD system via the metal foil tape feeding system, depositing a required carbon nanomaterial on the surface of the metal foil tape by CVD, directly collecting by the collection system or directly post-treating the carbon nanomaterial by a post-treatment system, and even directly producing a end product of the carbon nanomaterial. All the systems in the invention are arranged in the open atmosphere rather than an air-isolated closed space. The invention can realize round-the-clock continuous operation to greatly improve the production efficiency of carbon nanomaterials.

7 Claims, 8 Drawing Sheets

(51) Int. Cl.
*C23C 16/52* (2006.01)
*C23C 16/56* (2006.01)
*C01B 32/15* (2017.01)
*C01B 32/182* (2017.01)
*C01B 32/158* (2017.01)
*C01B 32/186* (2017.01)
*C01B 32/184* (2017.01)

(52) U.S. Cl.
CPC .......... *C23C 16/0272* (2013.01); *C23C 16/52* (2013.01); *C23C 16/56* (2013.01); *C01B 32/15* (2017.08); *C01B 32/158* (2017.08); *C01B 32/182* (2017.08); *C01B 32/184* (2017.08); *C01B 32/186* (2017.08)

(58) Field of Classification Search
CPC ....... C23C 16/56; C01B 32/15; C01B 32/158; C01B 32/182; C01B 32/184; C01B 32/186

USPC .......................................... 427/249.1, 255.28
See application file for complete search history.

(56) References Cited

U.S. PATENT DOCUMENTS

| | | | |
|---|---|---|---|
| 2013/0174968 A1* | 7/2013 | Vlassiouk | B82Y 30/00 156/60 |
| 2013/0236631 A1* | 9/2013 | Malecki | B82Y 30/00 118/712 |
| 2015/0140211 A1* | 5/2015 | Strobl | C23C 16/4404 118/725 |
| 2019/0047867 A1* | 2/2019 | Botte | B01J 37/348 |

FOREIGN PATENT DOCUMENTS

| | | |
|---|---|---|
| CN | 103305806 B | 6/2015 |
| CN | 104477898 B | 8/2016 |
| CN | 107201505 A | 9/2017 |

* cited by examiner

METHOD FOR OPENLY AND CONTINUOUSLY GROWING CARBON NANOMATERIALS

RELATED APPLICATIONS

This is a U.S. national phase application of the International Application PCT/CN2019/121124 filed Nov. 27, 2019, which claims the benefit of the Chinese Patent Application CN201811222119.8 filed Oct. 19, 2018, each of which is incorporated herein by reference in its entirety.

FIELD OF THE INVENTION

The present application relates to the field of chemical vapor deposition (CVD) equipment for growing carbon nanomaterials (such as graphene or carbon nanotubes), in particular to equipment and preparation method for open and continuous growth of a carbon nanomaterial, where a metal foil tape is continuously input from atmosphere into the equipment and then continuously output after a CVD process, with a required product grown on the surface of the foil tape, under the condition of micro positive pressure or positive pressure.

BACKGROUND OF THE INVENTION

Like diamond and graphite, graphene and carbon nanotubes both are allotropes of carbon. Graphene can be figuratively considered as a layer of two-dimensional crystal with a thickness of only one atom extracted from a graphite single crystal. Under a less strict circumstance, a nanomaterial composed of a few layers of graphene is also called graphene. Carbon nanotubes are divided into single-walled carbon nanotubes and multi-walled carbon nanotubes. The single-walled carbon nanotube can be considered as a seamless tube having a nanoscale diameter formed by winding a single layer of graphene in a given direction, while the multi-walled carbon nanotube can be considered as a carbon nanotube formed of two or more single-walled carbon nanotubes having different diameters by nesting one in another, like a Russian doll, with interlayer spacing close to that of graphite. Since the carbon nanomaterials have excellent chemical and physical properties, they can find wide application in many fields such as mechanics, optics, electronics and thermodynamics.

Among various preparation methods of carbon nanomaterials, a CVD process is currently regarded as the most promising method for preparing high-quality carbon nanomaterials. CVD is an abbreviation of chemical vapor deposition referring to a gas phase reaction at a high temperature, for example, a method for thermal decomposition of metal halide, organic metal, hydrocarbon and the like, hydrogen reduction or chemical reaction of mixed gas thereof at a high temperature to obtain an inorganic material such as metal, oxide and carbide. At present, it is widely applied to high-purity metal refining, powder synthesis, semiconductor films, etc., and is a featured technical field. Although the CVD process is better than other methods, it has not seen a breakthrough in equipment and process for rapid continuous and large-scale preparation of high-quality carbon nanomaterials. In a conventional CVD process, a substrate material is placed in a closed chamber, the sample is heated under vacuum, low pressure or atmospheric pressure, then hydrogen gas and carbon-containing gas, diluted by carrier gas or not, are introduced into the chamber to grow a required carbon nanomaterial by CVD on the surface of the substrate, and finally the sample is cooled and taken out. Due to the limited substrate size, and long-time heating and very long cooling process, the production efficiency is very low, which heavily restricts the application of carbon nanomaterials.

In order to improve the production efficiency, especially the production efficiency of graphene, in recent years, it has been tried to heat one or more rolls of metal foil tapes at one time, and a special fixture is used to separate each layer of the metal foil tapes, like in CN104477898B. Also, few institutions and individuals have started to develop roll-to-roll CVD equipment and processes for production of graphene, but its quality or efficiency is still far from requirements in application. The typical roll-to-roll graphene preparation equipment, developed by Sony Corporation of Japan, adopts electric heating of a substrate to prepare graphene. Due to the heating mode and the uniformity problem, it can only prepare noncontinuous graphene. The roll-to-roll equipment developed by Massachusetts Institute of Technology tries to improve the heating efficiency by winding a metal foil tape on a quartz tube, thereby realizing rapid growth, but the quality of graphene is still not desirable. Similar patents can also be found in China, such as CN107201505A, CN102976318B and CN103305806B. More prominently, concentrations of hydrogen gas and carbon-containing gas are often higher than explosion limits during the growth process of graphene.

Technical Problems

In related arts, roll-to-roll equipment still must be a closed system working under low pressure or atmospheric pressure, and stopped for roll replacement after producing one roll, resulting in undesirable working efficiency and failure in open and continuous production of graphene under the atmosphere, not to mention integration with a production line of graphene end products.

OBJECTS AND SUMMARY OF THE INVENTION

An object of the present application is to overcome the defects in prior arts and provide equipment and method for open and continuous growth of a carbon nanomaterial. The equipment not only can realize continuous round-the-clock large-scale growth of high-quality large-area carbon nanomaterials to greatly improve the production efficiency, but also can be integrated with a production line of application products to reduce damage of intermediate processes to the carbon nanomaterials and improve the yield. The method, from carbon nanomaterial growth and processing until end product preparation, is continuously implemented in a production line, without requiring a sealed space, thereby achieving high production efficiency.

In order to achieve the object mentioned hereinabove, the present application provides equipment for open continuous growth of a carbon nanomaterial, which comprises a metal foil tape feeding system, a CVD system and a collection system, all located in open air. The metal foil tape feeding system is used for transferring a metal foil tape from the atmosphere to the CVD system; and the CVD system is used for reaction to deposit a carbon nanomaterial, and the metal foil tape with the carbon nanomaterial attached thereto enters the collection system.

The CVD system comprises a CVD furnace and a control system in signal connection with the CVD furnace. A slit coupler is separately coupled with the inlet and the outlet of the CVD furnace in a sealing manner, and axially provided with at least one slit having one end connected with the CVD furnace and the other end open to the atmosphere. The slits of the two slit couplers correspond to one another. The metal foil tape goes in/out of the CVD furnace via each pair of the slits.

Each slit coupler is provided with at least one cooling loop composed of cooling water inlet and outlet pipes in the periphery of the slit, and the cooling water inlet and outlet pipes are provided therein with cooling water for cooling the slit couplers.

Each slit coupler is also provided with multiple gas inlet pipes, and the end of each gas inlet pipe is connected in a sealing manner to different parts of the CVD furnace. Carrier gas and reaction gas required by the CVD system are introduced to each part of the CVD furnace via the gas inlet pipes, and always maintain a positive pressure or micro positive pressure state in the CVD furnace. The gas inlet pipes constitute the only passages for supplying the required carrier gas and reaction gas to the CVD furnace.

The slit coupler is further provided with a protection gas injection port connected with the slit, and the protection gas required by the CVD system is directly led into the slit of the slit coupler via the protection gas injection port. Tail gas generated inside the CVD system is discharged via the slits at the two ends, and mixed with the protection gas in the slits before sprayed out from the open ends of the slits. The action of spraying the tail gas and the protection gas out of the slits keeps the slits dynamically sealed all the time to avoid air leaking or permeating into the CVD furnace via the slits.

Optionally, each slit coupler is provided with multiple slits, and the slits of the two slit couplers are in one-to-one corresponding arrangement.

Optionally, the CVD system is further provided therein with an online quality monitoring feedback device in signal connection with the control system. The online quality monitoring feedback device is used for online monitoring the metal foil tape passing through the CVD system to deposit a carbon nanomaterial, and feeding the signal back to the control system. The control system accordingly controls the growth conditions of the carbon nanomaterial in the CVD furnace.

Optionally, the CVD system is arranged in a ventilation cupboard having its exhaust pipe connected with a tail gas treatment unit, and its exhaust volume much larger than the total amounts of gases discharged from the CVD system.

Further, the control system is provided with a safety monitoring control subsystem, which controls the flow rates of the carrier gas, the reaction gas and the protection gas so as to reduce the concentration of combustible and explosive gas discharged via the slits to below its lower explosion limit. The exhaust pipe of the ventilation cupboard is provided therein with a gas flow sensor in signal connection with the safety monitoring control subsystem to monitor the flow rate of gas discharged from the CVD furnace into the ventilation cupboard. When the gas flow rate inside the ventilation cupboard fails to reach a safety threshold or drops to below the safety threshold during operation, the gas flow sensor sends a signal to the safety monitoring control subsystem, and the safety monitoring control subsystem accordingly enforces cutoff of a heating power supply for the CVD furnace as well as delivery of the carrier gas and the reaction gas in the gas inlet pipes and gives an alarm.

The CVD system is further provided with a gas concentration sensor in signal connection with the safety monitoring control subsystem to monitor the concentration of combustible explosive gas discharged from the CVD furnace via the slits. When the gas concentration sensor detects that the concentration of combustible explosive gas is close to the lower explosion limit, it sends a danger-implying signal to the safety monitoring control subsystem, and the safety monitoring control subsystem accordingly enforces cutoff of the combustible explosive gas flow while turning off the heating power supply for the CVD system, and gives an alarm.

A workshop where the ventilation cupboard is located can be additionally provided with gas concentration sensors in signal connection with the safety monitoring control subsystem to monitor the concentrations of combustible explosive gas, oxygen gas and carbon monoxide in the workshop. When the second gas concentration sensor detects that the concentration of combustible explosive gas is close to the lower explosion limit, the concentration of oxygen gas drops to an alarm level or the concentration of carbon monoxide exceeds a standard, it sends a danger-implying signal to the safety monitoring control subsystem, and the safety monitoring control subsystem accordingly enforces cutoff of the combustible explosive gas flow and even the carrier gas and protection gas flow while turning off the heating power supply for the CVD system, and gives an alarm.

Optionally, the metal foil tape feeding system comprises an unwinding roller for supporting the metal foil tape, drive rollers for driving the metal foil tape to move forward, and guide rollers for adjusting the moving path of the metal foil tape. The collection system is provided therein with a winding roller for winding and collecting the metal foil tape with a carbon nanomaterial attached thereto. All the rollers are in signal connection with the control system.

The adjacent ones of the unwinding roller, the drive rollers, the guide rollers and the winding roller are mutually asynchronous rollers. The metal foil tape is at least provided with a stress sensor, and/or the unwinding roller, the drive rollers, the guide rollers and/or the winding roller are provided with at least a torque sensor. The and/or the torque sensors are in signal connection with the control system, which controls the rotating speeds and the torques of all the rollers based on the signals from the stress and/or the torque sensors.

Optionally, the metal foil tape feeding system further comprises a pretreatment system arranged in the moving path of the metal foil tape for cleaning, polishing and/or coating surface catalyst to the metal foil tape. The cleaning includes, but not limited to, surface degreasing, impurity removal and oxide removal; the polishing includes, but not limited to, mechanical polishing, chemical polishing and/or electrolytic polishing; and the surface catalyst coating includes, but not limited to, physical coating, chemical coating and/or electrochemical coating.

Optionally, the CVD furnace is a high-temperature heating furnace having a closed inlet and outlet. The high-temperature heating furnace is an integrated furnace having multiple segments under independent control. Each segment of the CVD furnace is at least provided with a temperature sensor in signal connection with the control system, which controls the temperatures and the heating or cooling rates in the different segments of the CVD furnace based on the signal from the temperature sensor.

Optionally, the collection system is further provided with a post-treatment system between the second slit coupler and the winding roller.

A method for open and continuous growth of graphene by use of the equipment includes placing a metal foil tape into the metal foil tape feeding system, continuously conveying it to the CVD system under the conveying action of the metal foil tape feeding system, introducing argon gas or nitrogen gas as carrier gas and protection gas of the CVD furnace into the CVD system according to requirements of different characteristic graphene, as well as hydrogen gas and at least one type of carbon-containing gas as reaction gas of the CVD furnace into the CVD system while controlling the growth temperature of the CVD furnace to 500-1,200° C., and conveying the metal foil tape to the collection system after graphene is grown on the surface of the metal foil tape.

A method for open and continuous growth of carbon nanotubes by use of the equipment includes continuously conveying a metal foil tape coated with catalyst into the CVD system via the metal foil tape feeding system, introducing argon gas or nitrogen gas as carrier gas and protection gas of the CVD furnace into the CVD system according to requirements of different characteristic carbon nanotubes, as well as hydrogen gas and at least one type of carbon-containing gas as reaction gas of the CVD furnace into the CVD system while controlling the growth temperature of the CVD furnace to 400-1,000° C., and conveying the metal foil tape to the collection system after the carbon nanotubes are grown on the surface of the metal foil tape.

The catalyst is a nanofilm or nanoparticles composed of iron, cobalt and/or nickel, or a nanofilm or nanoparticles composed of oxides/salts thereof, and can be implemented by pretreatment on the metal foil tape via the pretreatment system. The pretreatment includes directly coating the catalyst to the surface of the metal foil tape, or coating a transition layer to the surface of the metal foil tape before coating the catalyst.

The present application has the following advantages over prior arts:

(1) The slit couplers in the application can realize reliable sealed coupling with the CVD furnace to form an integral body, and at the same time play the roles of guiding the metal foil tape, stopping air and cooling. The carrier gas and the protection gas used in the CVD furnace can be introduced to different parts inside the CVD furnace only via the gas inlet pipes of the slit coupler. The protection gas is directly filled into each slit. When the gas in the CVD furnace overflows to form positive pressure or micro positive pressure, the generated tail gas is mixed with the protection gas in the slits before sprayed to the outside via the slits of the slit couplers at the two ends of the CVD furnace. For environment protection, the CVD system can be arranged in the ventilation cupboard. The tail gas is further discharged via an exhaust device of the ventilation cupboard after it is discharged into the ventilation cupboard. The action of spraying the tail gas and the protection gas out of the slits keeps the slits dynamically sealed all the time to avoid air leaking or permeating into the CVD furnace via the slits. Therefore, the metal foil tape feeding system, the CVD system and the collection system can be completely arranged in the atmosphere, without the need for air isolation, to realize continuous feeding via the metal foil tape feeding system to the CVD system and continuous output of the carbon nanomaterial product via the collection system. Finally, round-the-clock continuous growth is achieved to greatly improve the production efficiency, while damage to the product caused by intermediate processes is reduced to further improve the yield;

(2) Also provided are the online quality monitoring feedback system and the safety monitoring subsystem both in signal connection with the control system, so as to maximally ensure personal and property safety. A quality monitoring result of the online quality monitoring feedback system can be fed back to the control system to thereby automatically adjust various gas flow rates and proportions and temperature inside the CVD furnace, and realize optimal control on the quality of a carbon nanomaterial. Based on the signal from the gas concentration sensor installed in the CVD system, the safety monitoring subsystem uses the carrier gas and the protection gas to dilute combustible explosive gas such as hydrogen gas and carbon-containing gas to concentrations below an explosion limit. Based on the flow monitoring feedback, when the flow of the carrier gas is insufficient to dilute the combustible explosive gas to below the explosion limit, the CVD furnace is disabled; or in the operating process, when the flow of the carrier gas is abnormal, the heating power supply for the CVD furnace is automatically turned off, the flow of the combustible gas is cut off and an alarm is given. In addition, all discharged gas is discharged to the tail gas treatment unit via the exhaust pipe of the ventilation cupboard where the gas flow sensor is installed. The CVD furnace cannot be started until the gas flow reaches a safety threshold; or in the operating process, when the gas flow drops to below the safety threshold, the power supply for the CVD furnace is forced to be turned off, the flow of the combustible gas is cut off and an alarm is given. Moreover, when the flow rate of cooling water decreases abnormally and the concentration of indoor combustible explosive gas increases abnormally or the content of oxygen gas decreases abnormally or carbon monoxide reaches a dangerous concentration, the heating power supply for the CVD furnace is also turned off, the flows of combustible explosive gas and even the carrier gas and the protection gas are cut off, and an alarm is given.

BRIEF DESCRIPTION OF FIGURES

Hereinafter, a brief introduction is given to the figures required in embodiments of the present application or the description in prior arts in order to clearly illustrate the embodiments or technical solutions in prior arts. It will be apparent that the figures described hereinafter are only some embodiments of the application. For those ordinary skills in the art, other figures can be obtained without creative work based on the structures shown in these figures.

REFERENCE SIGNS

I. Metal foil tape feeding system; II. CVD system; III. Collection system

1. Unwinding roller; 2. Metal foil tape; 3. Guide roller or drive roller; 4. Ventilation cupboard; 5. Slit coupler; 6. CVD furnace; 7. Exhaust pipe of ventilation cupboard; 8. Gas flow sensor; 9. Online quality monitoring feedback system; 10. Winding roller; 11. Pretreatment system; 12. Slit; 13. Gas inlet pipe; 14. Cooling water pipe; 15. Protection gas injection port; 16. Post-treatment system.

DETAILED DESCRIPTION OF THE EMBODIMENTS

Hereinafter, the technical solutions of the present application will be clearly and completely described in conjunction with the accompanying drawings. It will be apparent that the embodiments described herein are only part rather than all of the embodiments of the application. Based on the embodiments of the application, all the other embodiments obtained by those ordinary skills in the art without creative work fall within the protection scope of this application In the description of the present application, it should be noted that orientations or position relations indicated by terms such as central, above, below, left, right, vertical, horizontal, inside and outside are based on the figures, are only for conveniently describing the application and simplifying the description, rather than indicating or implying that the referred devices or elements must have the specific orientations or be structured or operated in the specific orientations, and therefore cannot be understood as a limitation of the application. In addition, terms such as first, second and third are only used for the purpose of description and cannot be understood as indicating or implying relative importance.

In the description of the application, it should be noted that, unless otherwise specified and limited clearly, terms such as installation and connection should be understood in a broad sense. For example, they can be interpreted as fixed connection, detachable connection or integral connection; mechanical connection or electrical connection; direct connection or indirect connection via a medium; or inner connection between two elements. For those ordinary skills in the art, the specific meanings of the terms in the application can be understood based on specific circumferences.

Furthermore, the technical features involved in different examples of the application described hereinafter can be combined with each other as long as they do not conflict with each other.

Example 1

Figure 1:
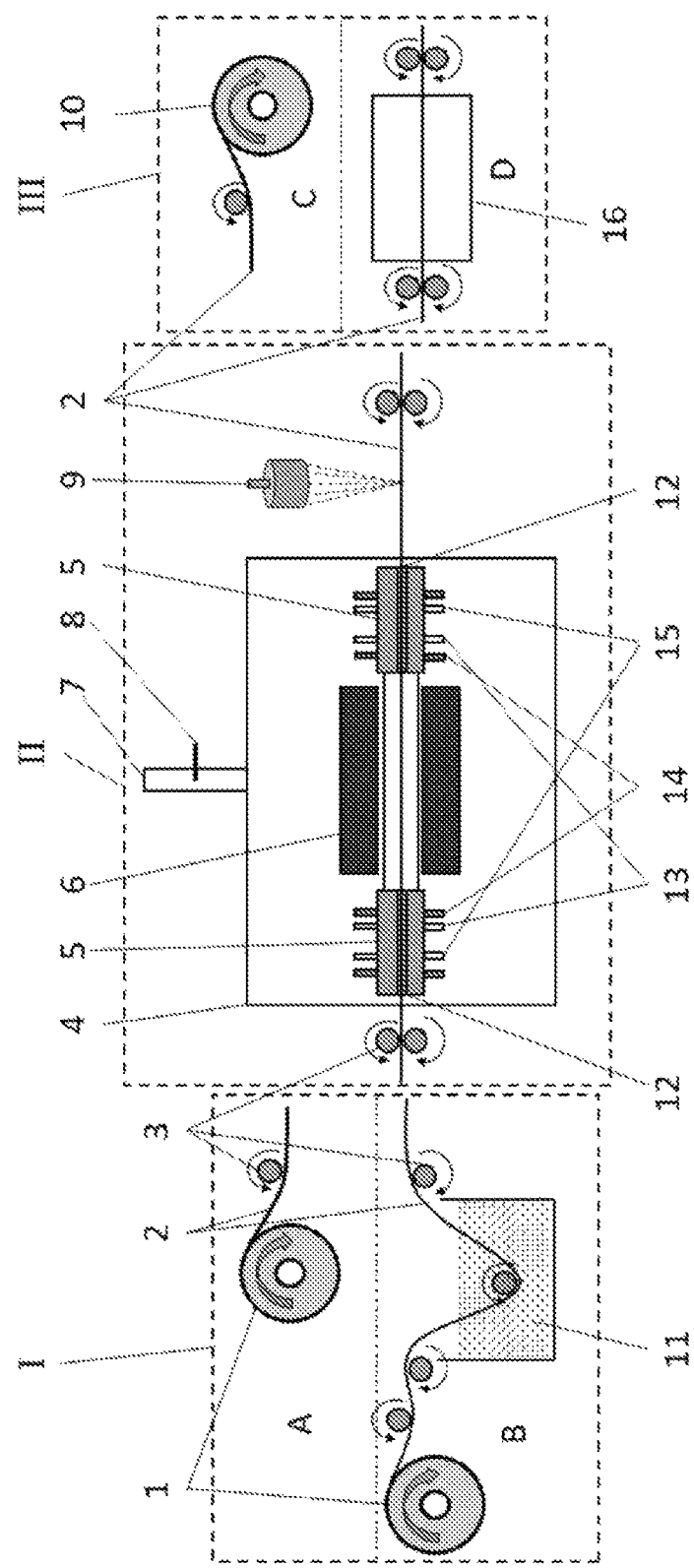
FIG. 1 is a schematic structural diagram of an embodiment of the present application.
Figure 2:
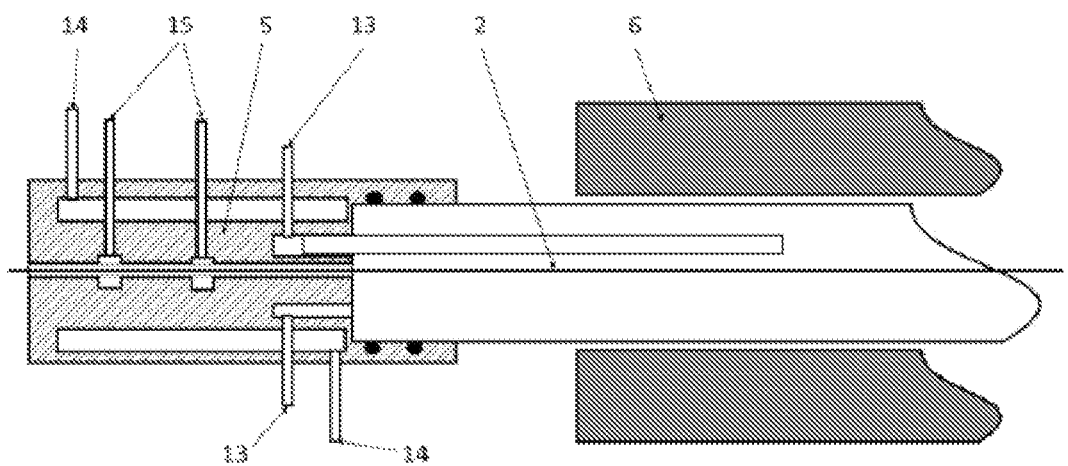
FIG. 2 is a partial schematic diagram of a CVD system of an embodiment of the present application.

As shown in FIG. 1, equipment for open and continuous growth of a carbon nanomaterial comprises a metal foil tape feeding system I, a CVD system II and a collection system III. The metal foil tape feeding system I is used for transferring a metal foil tape 2 from the atmosphere to the CVD system II; and the CVD system II is used for reaction to deposit a carbon nanomaterial, and the metal foil tape 2 with the carbon nanomaterial attached thereto enters the collection system III. The CVD system II comprises a CVD furnace 6 and a control system (not shown in the figure) in signal connection with the CVD furnace 6. A slit coupler 5 is separately coupled with the inlet and the outlet of the CVD furnace 6 in a sealing manner, and axially provided with at least one slit 12 having one end connected with the CVD furnace 6 and the other end open to the atmosphere. The slits 12 of the two slit couplers 5 correspond to one another. The metal foil tape 2 goes in/out of the CVD furnace 6 via each pair of the slits 12. Each slit coupler 5 is provided with a cooling loop composed of cooling water inlet and outlet pipes 14 in the periphery of the slit 12, and the cooling water inlet and outlet pipes 14 are provided therein with cooling water for cooling the slit couplers 5. Each slit coupler 5 is also provided with multiple gas inlet pipes 13, and the end of each gas inlet pipe 13 is connected in a sealing manner to different parts of the CVD furnace 6. Carrier gas and reaction gas required by the CVD system II are introduced to each part of the CVD furnace 6 via the gas inlet pipes 13, and always maintain a positive pressure or micro positive pressure in the CVD furnace 6. The gas inlet pipes 13 constitute the only passages for supplying the required carrier gas and reaction gas to the CVD furnace 6. The slit coupler 5 is further provided with a protection gas injection port 15 communicated with the slit 12, and the protection gas required by the CVD system II is directly led into the slit via the protection gas injection port 15. Tail gas generated inside the CVD system II is discharged via the slits 12 at the two ends, and mixed with the protection gas in the slits 12 before sprayed out from the open ends of the slits 12. The action of spraying the tail gas and the protection gas out of the slits 12 keeps the slits dynamically sealed all the time to avoid air leaking or permeating into the CVD furnace 6 via the slits 12.

The slit couplers 5 can realize reliable sealed coupling with the CVD furnace 6 to form an integral body, and at the same time play the roles of guiding the metal foil tape 2, stopping air and cooling. The carrier gas and the protection gas used in the CVD furnace 6 can be introduced to different parts inside the CVD furnace 6 only via the gas inlet pipes 13. The protection gas is directly filled into the open end of each slit 12. When the gas in the CVD furnace 6 overflows to form positive pressure or micro positive pressure, the generated tail gas is mixed with the protection gas in the slits before sprayed to the atmosphere via the slits 12 at the two ends of the CVD furnace 6. For environment protection, the CVD system II can be arranged in a ventilation cupboard 4. The tail gas is introduced to a tail gas treatment unit via an exhaust device of the ventilation cupboard 4 after it is discharged into the ventilation cupboard 4, and then discharged into the atmosphere after harmless treatment in the tail gas treatment unit. The action of spraying the tail gas and the protection gas out of the slits 12 keeps the slits 12 dynamically sealed all the time to avoid air leaking or permeating into the CVD furnace 6 via the slits 12. Therefore, the metal foil tape feeding system I, the CVD system II and the collection system II can be completely arranged in the atmosphere, without the need for air isolation, to realize continuous feeding via the metal foil tape feeding system I to the CVD system II and continuous output of a carbon nanomaterial product via the collection system III. Finally, round-the-clock continuous growth is achieved to greatly improve the production efficiency, while damage to the product caused by intermediate processes is reduced to further improve the yield.

In the example, the metal foil tape feeding system I comprises an unwinding roller 1 for supporting the coiled metal foil tape 2, drive rollers 3 for driving the metal foil tape 2 to move forward, and guide rollers 3 for adjusting the moving path of the metal foil tape 2. The metal foil tape feeding system I can further comprise a pretreatment system 11 arranged on the moving path of the metal foil tape 2 and used for cleaning, polishing and/or coating surface catalyst to the metal foil tape 2. The cleaning includes, but not limited to, surface degreasing, impurity removal and oxide removal; the polishing includes, but not limited to, mechanical polishing, chemical polishing, electrolytic polishing and combined polishing thereof; and the surface catalyst coating includes, but not limited to, physical coating, chemical coating, electrochemical coating and combined coating thereof. Preferably, the application adopts the metal foil tape feeding system I integrated with the pretreatment system 11, to further improve the quality of a prepared carbon nanomaterial product or reduce costs. For example, it is reported that cleaning and polishing can remarkably improve the quality of graphene prepared on a copper foil tape.

In the application, the metal foil tape 2 capable of being wound has a thickness ranging from a micrometer level to a millimeter level, a width ranging from a millimeter level to a meter level and a length from a meter level to a kilometer level or even infinite length (achieved by manually or automatically welding foil tapes of finite length). Metal includes, but not limited to, aluminum, copper, iron, cobalt, nickel and alloy or coating thereof. A copper film or other metal films can be coated to a low-cost metal foil tape 2 such as iron foil tape by electroplating or electroless plating, so as to reduce cost or enhance strength of the metal foil tape. For example, since the optimal temperature for growth of graphene on a copper foil tape is close to the melting point of copper, the growth temperature must be lowered appropriately if the copper foil tape is used for roll-to-roll growth of graphene, otherwise, the copper foil tape is easily pulled apart during the growth process. However, graphene growth at an optimal temperature can be realized by cleaning and polishing of the iron foil tape and chemical or electrochemical coating of a copper film to the surface of the iron foil tape. In addition, because of the price advantage of the iron foil tape over the copper foil tape, the cost can be further reduced on condition of reasonable process control. The carbon nanomaterial includes, but not limited to, graphene and carbon nanotubes. Graphene includes, but not limited to, noncontinuous graphene, continuous graphene, single-layer graphene, multilayer graphene and mixture thereof. Carbon nanotubes include, but not limited to, single-walled carbon nanotubes, multi-walled carbon nanotubes and mixture thereof, and can be a carbon nanotube array vertical to the surface of the metal foil tape 2 or randomly oriented.

The CVD system II can be arranged vertically, horizontally or obliquely at 0-90°, and is integrally or locally installed in the ventilation cupboard 4. In case of the vertical or oblique arrangement, the metal foil tape 2 can go in/out of the CVD furnace 6 from bottom up or from top down. The vertical arrangement is preferred in this Example.

The guide rollers 3 and the drive rollers 3 can be separately arranged between the CVD system II and the metal foil tape feeding system I as well as between the CVD system II and the collection system III, to ensure the conveying stability of the metal foil tape 2. The thermal expansion and contraction effect will incur different deformations of the metal foil tape 2 at different temperatures. In order to avoid buckling of the metal foil tape 2 due to thermal expansion or breakage of the metal foil tape 2 by cooling-induced contraction, all the rollers, including the unwinding roller 1, the drive rollers 3, the guide rollers 3 and the winding roller 10 in the collection system III, are asynchronous rollers; the CVD system II is provided with at least one temperature sensor (not shown in the figure); the metal foil tape 2 is at least provided with a stress sensor (not shown in the figure), or the unwinding roller 1, the drive rollers 3, the guide rollers 3 and/or the winding roller 10 are at least provided with a torque sensor (not shown in the figure); the temperature sensor, the stress and/or the torque sensors are in signal connection with the control system; the control system will control the torque of the corresponding roller based on signals fed back in real time by the stress and/or the torque sensors, or control the temperatures at different segments and the heating or cooling rate inside the CVD furnace 6 based on signals transmitted from the temperature sensor, to prevent buckling of the metal foil tape 2 due to thermal expansion in the CVD furnace 6, and pulling-apart due to cooling contraction when shutdown or too large torque.

The CVD furnace 6 is an independently-controlled integrated furnace having a single segment or multiple segments, or a combined furnace composed of multiple independently-controlled integrated furnaces each having a single segment. In case of the multiple furnaces, they are connected by sealed pipes. Preferably, the CVD furnace 6 in the example is a tubular (quartz tube or corundum tube) high-temperature heating furnace, and more preferably a multi-segment independently-controlled quartz tubular high-temperature heating integrated furnace, thereby realizing annealing of the metal foil tape 2, growth of a carbon nanomaterial, etc. in different segments. It depends on production requirements in a specific situation. Taking graphene growth for example, the CVD furnace 6 can be composed of a metal foil tape preheating annealing furnace and a growth furnace, or an integrated furnace divided into at least two independent segments each having independently controllable atmosphere and temperature to thereby realize preheating/annealing and growth separately in the different segments.

In order to further improve the production efficiency of open and continuous growth of a carbon nanomaterial, the slit couplers 5 each are provided with multiple slits 12. The slits 12 of the two opposed slit couplers 5 are in one-to-one corresponding arrangement. Protection gas is directly introduced into each slit 12 via the protection gas injection port 15. The multiple slits 12 allow multiple metal foil tapes 12 to go in/out, so that the carbon nanomaterial is grown simultaneously on the multiple metal foil tapes 2 in the CVD furnace 6 to improve the yield. The section of each slit can be, but not limited to, a rectangle, a trapezoid or other complex shapes, such as toothed quadrilateral cross section and hourglass-shaped longitudinal section (consistent with the moving direction of the metal foil tape), as long as it is beneficial to guiding of the metal foil tape, cooling and air blocking.

The reaction gas used in the application includes, but not limited to, hydrogen gas, carbon-containing gas such as methane, ethane, ethylene, acetylene and alcohol (vaporized), and mixed gas thereof. The protection gas has a similar type to the carrier gas and can be the same as or different from the carrier gas. The protection gas and the carrier gas include, but not limited to, argon gas, helium gas, nitrogen gas and mixed gas thereof. Considering the preparation quality of a carbon nanomaterial alone, the carrier gas and the protection gas are preferably argon gas; and nitrogen gas obtained by liquid nitrogen vaporization is preferred if further taking into account the cost. The carbon-containing gas depends on the kind of a carbon nanomaterial to be prepared. For example, methane is preferred in preparation of single-layer high-quality continuous graphene, while acetylene or ethylene is preferred in low-temperature deposition of multilayer graphene.

Moreover, the CVD system II is further provided with an online quality monitoring feedback device 9 in signal connection with the control system to monitor growth of a carbon nanomaterial on the metal foil tape 2 in the CVD furnace and feed a quality monitoring result back to the control system. The control system regulates the flow rates and proportions of various gas and the temperature of the CVD furnace based on the signal to realize optimal control on the quality of the carbon nanomaterial.

For the sake of safety and environment protection, the CVD system II is arranged in the ventilation cupboard 4. An exhaust pipe of the ventilation cupboard 4 is connected with the tail gas treatment unit (not shown in the figure). In addition, the control system is further provided with a safety monitoring control subsystem (not shown in the figure). The safety monitoring control subsystem can form three barriers for safety protection by means of various gas flow sensors, cooling water flow sensors and gas concentration sensors (not shown in the figure) in the CVD system and a workshop as well as a gas flow sensor 8 in the ventilation cupboard 4, all the sensors in signal connection with the control system.

First, gas flow sensors (such as mass flow meters) are used to control the flow rates of combustible explosive gas (hydrogen gas, methane, etc.), carrier gas and protection gas introduced into the CVD furnace, and the concentration of the combustible explosive gas discharged from the CVD furnace via the slits is diluted to below the explosion limit by the carrier gas and the protection gas, thereby forming the first safety protection. When the flow of the carrier gas is insufficient to dilute the combustible explosive gas to below the explosion limit, the CVD furnace is disabled, or a heating power supply for the operating CVD furnace 6 is automatically turned off, the flow of the combustible gas is cut off, and an alarm is given.

Second, a cooling water sensor in the CVD system and a combustible explosive gas concentration sensor in the ventilation cupboard 4 form the second safety protection. The combustible explosive gas concentration sensor is used for monitoring the concentration of the combustible explosive gas discharged from the CVD furnace via the slits, and the gas flow sensor 8 in the ventilation cupboard 4 is used for monitoring the exhaust volume of the ventilation cupboard which is designed to be much larger than the total exhaust volume of various gas in the CVD system. All the gas discharged from the CVD system is collected by the ventilation cupboard 4 and then discharged to the tail gas treatment unit via an exhaust pipe 7 of the ventilation cupboard. When the concentration of the combustible explosive gas exceeds a standard, the flow rate of cooling water drops abnormally or the gas flow under monitoring of the gas flow sensor 8 fails to reach a safety threshold, the CVD furnace is disabled, or the power supply for the operating CVD furnace 6 is forcibly turned off, the flow of the combustible gas is cut off, and an alarm is given.

Last, the workshop where the ventilation cupboard is located is also provided with gas concentration sensors (not shown in the figure) to form the third safety protection. These gas concentration sensors are used for monitoring concentrations of combustible explosive gas, oxygen gas and carbon monoxide. When the concentration of indoor combustible explosive gas increases abnormally, or the content of oxygen gas decreases abnormally or carbon monoxide reaches a dangerous concentration, the safety monitoring control subsystem will also turn off the heating power supply for the CVD furnace, cut off the flows of carrier gas, protection gas and reaction gas, and give an alarm. Specifically, if the content of oxygen gas decreases or carbon monoxide increases, it means failure of previous protection measures to cause oxygen deficiency, and the ventilation cupboard 4 does not extract all the gas, but discharges into the workshop. As a result, all the gas should be cut off to prevent further decrease in the oxygen concentration. As for the problems related to explosion, they can be solved by only cutting off the flow of combustible explosive gas while keeping discharging the protection gas and the carrier gas to further dilute the residual combustible explosive gas.

Finally, the collection system III is used for directly winding the metal foil tape 2 with a carbon nanomaterial grown thereon onto the winding roller 10 without any post-treatment, or the collection system III is further provided with a post-treatment system 16 for post-treatment or direct production of a carbon nanomaterial end product, to thereby form a complete continuous production line involving carbon nanomaterial growth, processing and end product preparation. The post-treatment includes separating the grown carbon nanomaterial from the metal foil tape 2 and processing to give an end product, or further enhancing the adhesion of the carbon nanomaterial to the surface of the metal foil tape 2. For example, graphene is separated from the metal foil tape 2 in the post-treatment process, to produce graphene-based electronic devices such as touch screens and sensors. For carbon nanotubes, the post-treatment may involve glue filling treatment to fill up gaps between the carbon nanotubes and remarkably enhance the adhesion of the carbon nanotubes to the metal foil tape 2.

Example 2

Hereinafter is given a method for growing a single-layer continuous high-quality graphene film on a copper foil tape by use of the equipment.

It should be noted that the method adopts the simplest equipment. The metal foil tape feeding system I, as shown in FIG. 1, does not comprise the pretreatment system 11. The CVD system II is not equipped with the online quality monitoring system 9. The CVD furnace 6 is a vertical quartz tubular single heating furnace having a single segment and a quartz tube diameter of 25 mm Each slit coupler has only one slit 12. The collection system III does not comprise the post-treatment system 16. Both the carrier gas and the protection gas are argon gas, and the reaction gas includes hydrogen gas and methane having their concentrations diluted by the argon gas to below the explosion limits. Methane can be replaced by ethane, acetylene, ethylene, (vaporized) alcohol, etc. Unless otherwise stated, all the gas is high-purity gas delivered via pipelines to an equipment room by way of central gas supply. The gas flow rates are controlled by mass flow meters, and the temperature of the CVD furnace 6 is monitored by a thermocouple and regulated by a power supply having a PID function.

The method specifically includes the following steps:

1. Turning on a working power supply for the ventilation cupboard 4 while ensuring an indicator lamp of the gas flow sensor 8 installed in the exhaust pipe 7 of the ventilation cupboard to be green, which indicates that the flow rate is higher enough than the total flow rates of carrier gas, protection gas and reaction gas mentioned in the subsequent steps.

2. Installing a coiled copper foil tape (having a width of 11 mm, a thickness of 40 μm and a purity of 99.98%), suitable for graphene growth, on the unwinding roller 1, manually feeding into the quartz tube of the CVD furnace 6 via the slit 12 of the first slit coupler 5 by way of the guide roller 3 and the drive roller 3, and winding on the winding roller 10 of the collection system III via the slit 12 of the second slit coupler 9.

3. Introducing cooling water to the two slit couplers and argon gas at a flow rate of 5-9 slm via the mass flow meter into the quartz tube from the slit coupler while introducing protection gas into the slits 12 of the two slit couplers, wherein all the gas is discharged from the slits 12 at the two ends to the tail gas treatment system via the ventilation cupboard 5, and the process lasts for 3-5 min.

4. Turning on a power supply for the quartz tube heating furnace, setting the heating temperature at 900-1,000° C., ramping up at a rate of 20° C./min until the temperature is stably maintained at the set heating temperature.

5. Introducing hydrogen gas and methane into the quartz tube from the slit coupler after mixing with the carrier gas at a rate of 80-150 sccm and 0.5-5 sccm, respectively, via the mass flow meters.

6. Turning on power supplies for the unwinding roller 1, the winding roller 10 and all the guide rollers 3 and drive rollers 3 20 min after the hydrogen gas and methane are introduced, so that the copper foil tape passes through the CVD furnace at a speed of 5-9 mm/min.

7. When the copper foil tape on the unwinding roller 1 is about to be used up, the power supplies (for the unwinding roller 1, the winding roller 10 and all the guide rollers 3 and drive rollers 3) for copper foil tape delivery can be turned off. A new coiled copper foil tape is manually replaced and welded with the copper foil tape to be used up. The power supplies for copper foil tape delivery are turned on again to smoothly input/output the new copper foil tape into/out of the CVD system II. At the moment, the power supplies can be turned off again and the copper foil tape is cut off at the welded position so that the coiled copper foil tape with graphene grown thereon can be taken out. The new copper foil tape is wound on a new winding roller 10 and the power supplies are turned on again. Such a process will be automated in the future.

8. If the step 7 is repeated, round-the-clock continuous growth (short pause will occur during replacement) can be realized.

9. If graphene growth needs to be stopped, the power supplies for copper foil tape delivery are firstly turned off, then methane is cut off and finally the heating power supply for the CVD furnace 6 is turned off. When the temperature of the CVD furnace 6 drops to room temperature, the cooling water of the slit couplers, the hydrogen gas and all the carrier gas and protection gas are cut off. Finally, the power supply for the ventilation cupboard 4 is turned off.

Figure 3:
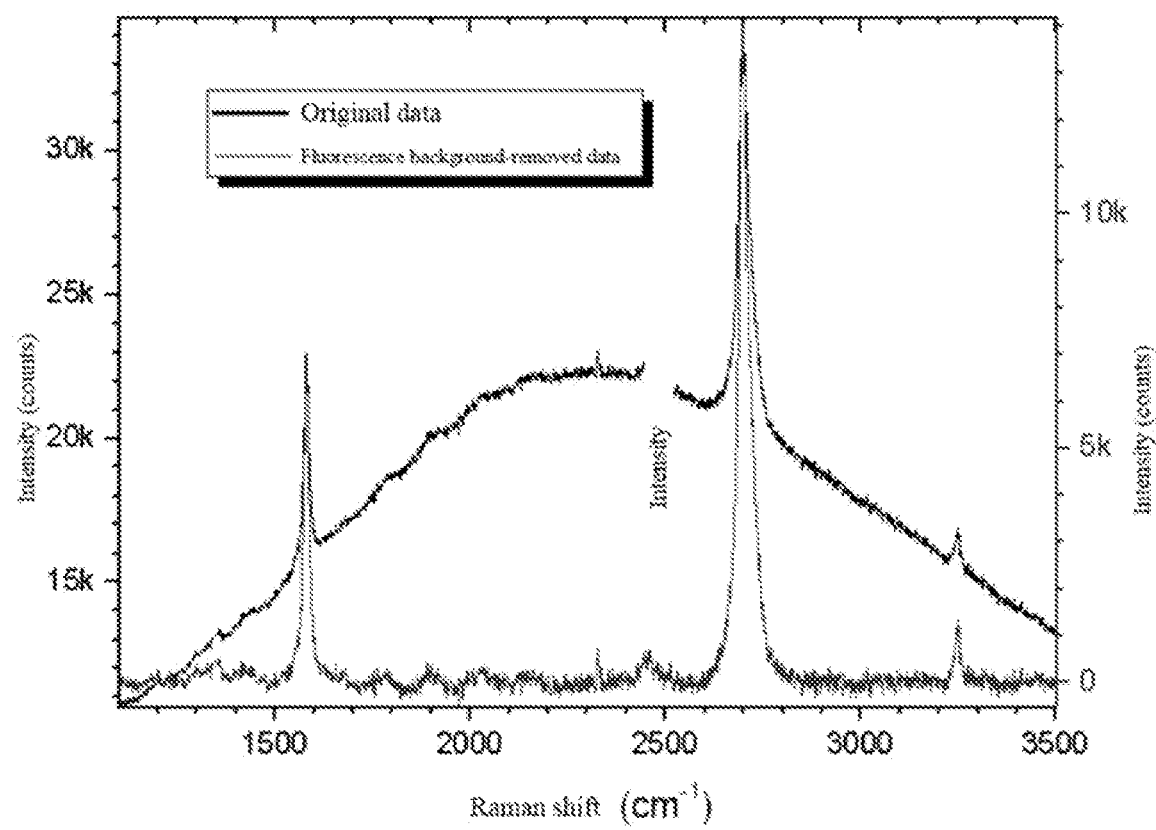
FIG. 3 is a Raman spectrum of graphene together with a copper foil tape prepared in Example 2 of the present application.
Figure 4:
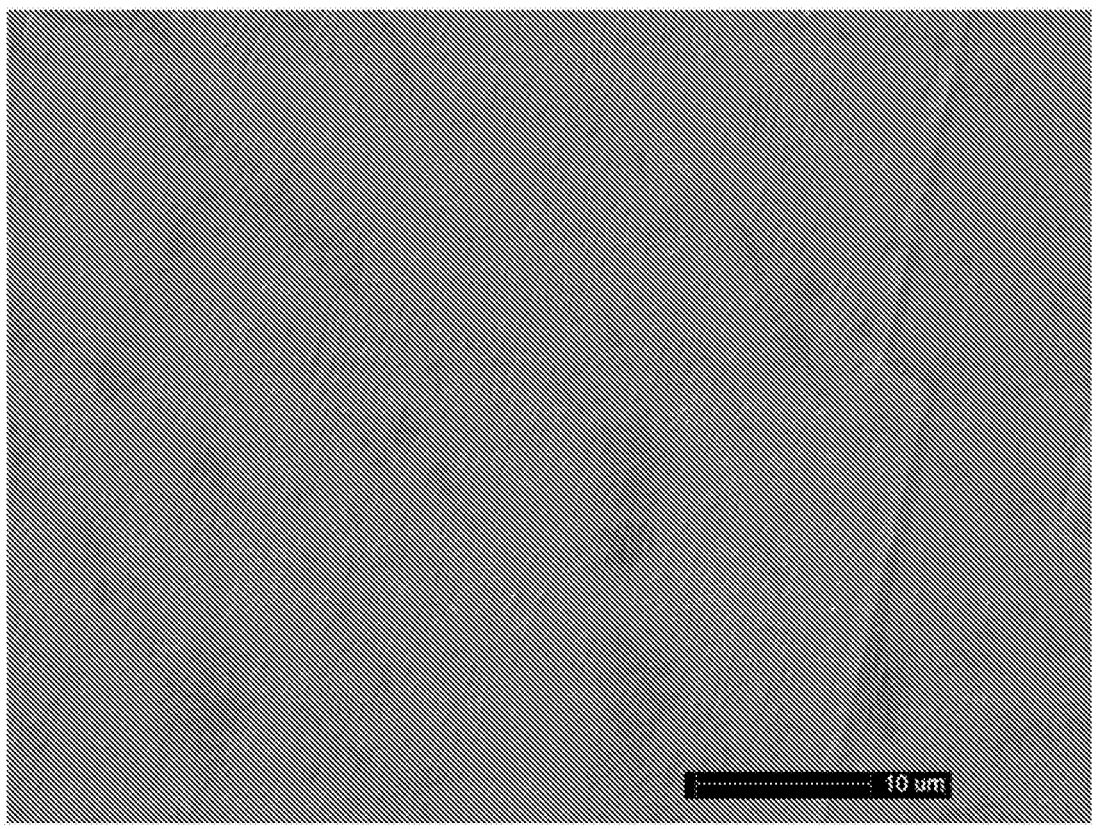
FIG. 4 is an electron micrograph of graphene together with the copper foil tape prepared in Example 2 of the present application.
Figure 5:
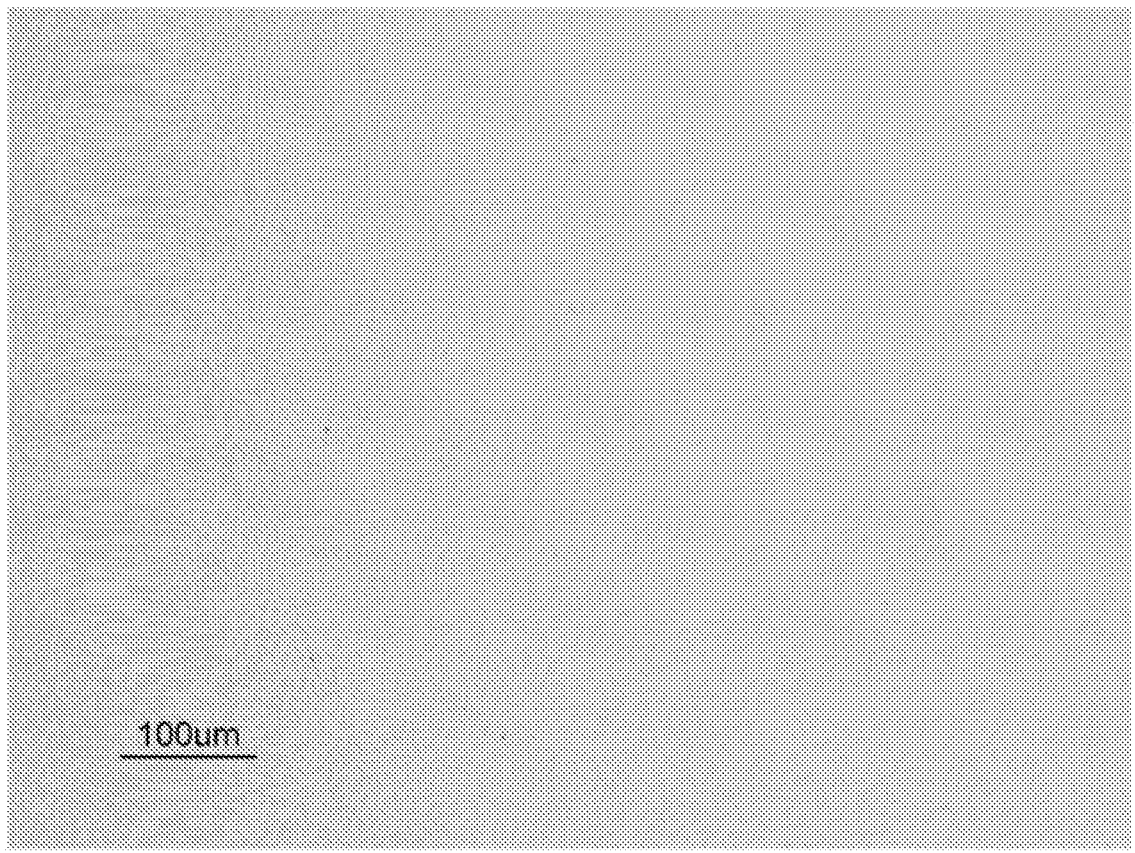
FIG. 5 is an optical micrograph of the graphene prepared in Example 2 and transferred to 300 nm $SiO_2$/Si.
Figure 6:
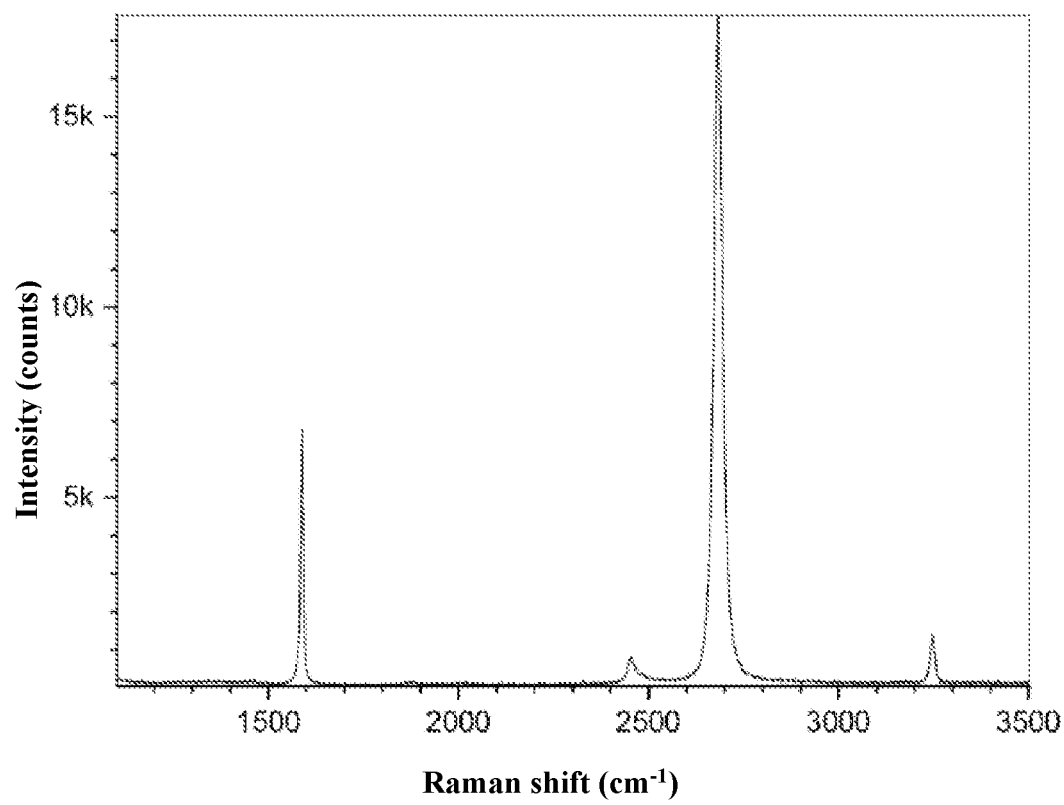
FIG. 6 is a Raman spectrum of the graphene prepared in Example 2 and transferred to 300 nm $SiO_2$/Si.

10. Taking out the coiled graphene-grown copper foil, and cutting off a segment for characterization with results shown in FIGS. 3-6. FIG. 3 shows that the intensity of a 2D peak near 2,700 cm$^{-1}$ is about twice that of a G peak near 1,590 cm$^{-1}$. In addition, a D peak around 1,350 cm$^{-1}$ is not clear, which means the prepared graphene is high-quality single-layer graphene. FIG. 4 shows that graphene is continuous single-layer graphene; FIG. 5 shows that the prepared graphene is uniform continuous single-layer graphene; and FIG. 6 shows that the prepared graphene is indeed high-quality single-layer graphene, all indicating the prepared graphene is single-layer, continuous and high in quality.

Example 3

In this Example, the equipment in Example 1 is used to grow a multilayer continuous graphene film on a nickel foil tape, and the difference from Example 2 lies in that:

1. The metal foil tape 2 is a nickel foil tape (having a width of 11 mm, a thickness of 25 μm and a purity of 99.9%).

2. The conveying speed of the nickel foil tape is 300-600 mm/min.

3. The set temperature range for growth is 500-900° C., preferably 750-900° C. The higher the temperature, the faster the growth rate and the faster the conveying speed of the nickel foil tape. Under the condition of the same conveying speed, the slower the conveying speed of the nickel foil tape, the more the graphene layers; or under the condition of a constant conveying speed, the higher the temperature, the more the graphene layers.

Figure 7:
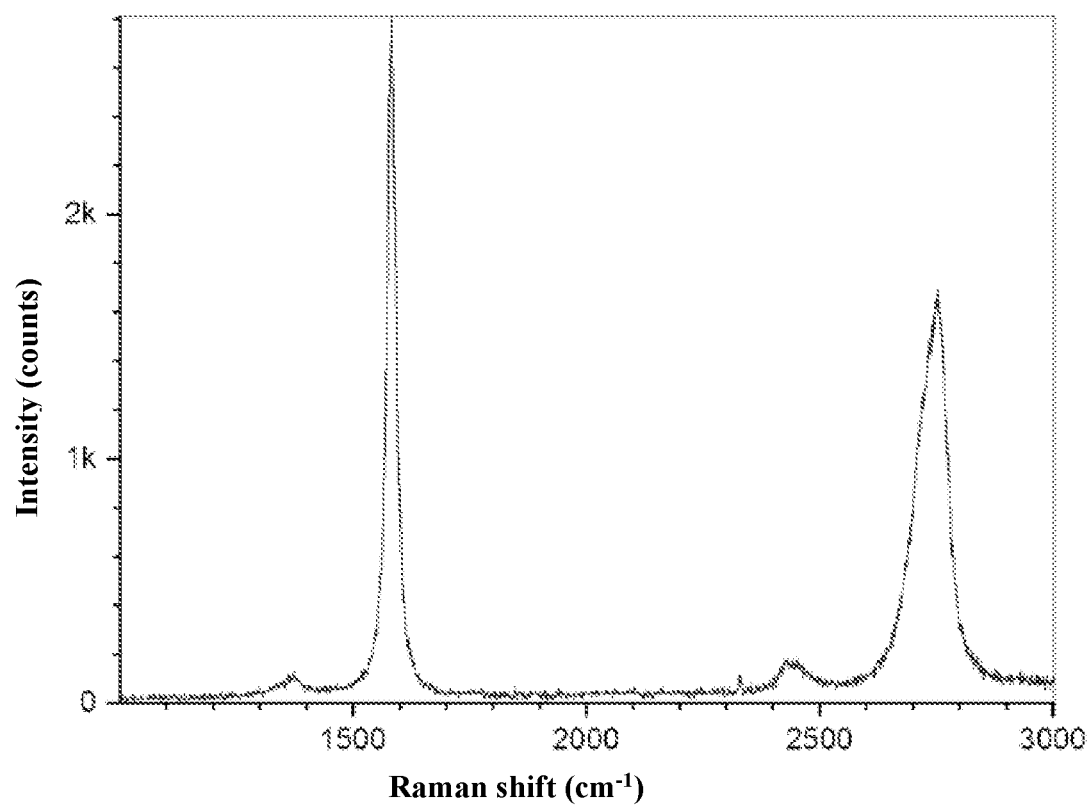
FIG. 7 is a Raman spectrum of continuous multilayer graphene grown on a nickel foil tape in Example 3.

4. The laser Raman characterization result in FIG. 7 shows that the intensity of a 2D peak is lower than that of a G peak, which means that the prepared graphene is multilayer graphene.

Example 4

In this example, the equipment in Example 1 and an additional metal foil tape pretreatment system are used to grow a carbon nanotube array on an aluminum foil tape, and the difference from Example 2 lies in that:

1. The pretreatment system 11 is adopted to coat a layer of catalyst to the surface of the aluminum foil tape 2. The catalyst can be a nanofilm or nanoparticles composed of iron, cobalt and/or nickel, or a nanofilm or nanoparticles of oxides/salts thereof. Taking ferrous chloride for example, a ferrous chloride solution tank is added between the unwinding roller 1 and the CVD system II and contains ferrous chloride prepared in advance and having its concentration monitored by a liquid concentration sensor. When the concentration decreases, solvent is automatically added to keep constant the concentration. The metal foil tape 2 passes through the solution tank (soaked in the solution tank) via the unwinding roller 1 and then gets dried during conveying to form a ferrous chloride film on the surface of the aluminum foil tape 2. The concentration of the ferrous chloride depends on performance of the carbon nanotubes to be grown, and the conveying speed and the total length of the aluminum foil tape 2 soaked in the solution tank. Because the surface of the aluminum foil tape 2 has an inherent alumina passivation layer serving as a transition layer, it is not necessary to coat a transition layer between the metal foil tape 2 and the catalyst. As for other metal foil tapes, a transition layer can be coated to the surface of the metal foil tape 2 as required before coating the catalyst, to prevent reaction between the catalyst and the metal foil tape during carbon nanotube growth, promote catalyst particle generation and enhance catalyst particle stability, thereby promoting the growth of the carbon nanotubes.

Figure 8:
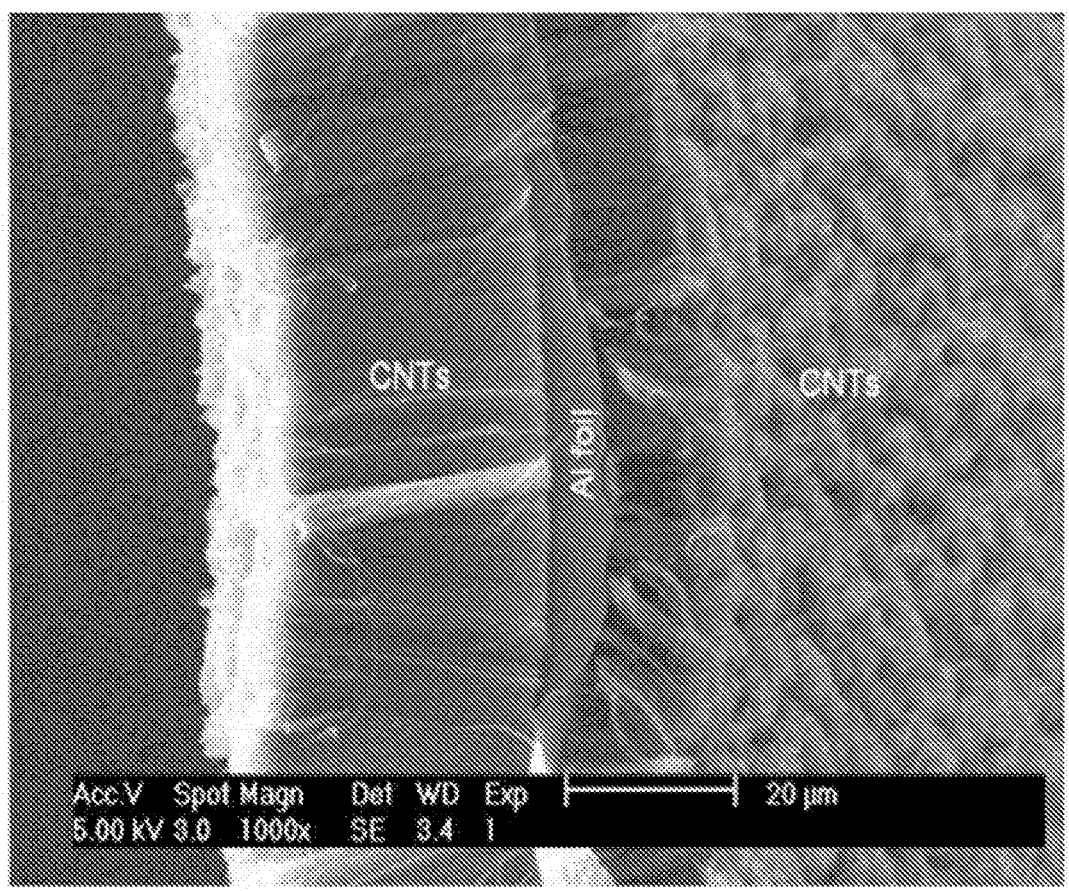
FIG. 8 is an electron micrograph of carbon nanotubes grown on the two sides of an aluminum foil tape in Example 4.

2. The carrier gas and the protection gas introduced into the CVD system II both are argon gas or nitrogen gas based on the characteristics of carbon nanotubes to be prepared. Reaction gas in the CVD furnace is hydrogen gas and at least one type of carbon-containing gas such as methane, ethane, acetylene, ethylene and (vaporized) alcohol. Taking acetylene for example, the growth temperature of the CVD furnace is 580-600° C., ferrous chloride is reduced by high-temperature reducing gas to form iron nanoparticles which further react with acetylene to form carbon nanotubes on the iron nanoparticles, thereby forming a carbon nanotube array (as shown in FIG. 8) on the metal foil tape 2 in the CVD system II and then directly collecting or processing into a end product by the collection system III.

Hereinabove mentioned are only the specific embodiments of the present application. The protection scope of the application is not limited thereto, and for those skilled in the art, modifications or replacements that easily come up within the technical scope disclosed by the application should be covered within the protection scope of the application. Therefore, the protection scope of the present application should be subject to the claims.

What is claimed is:

1. A method for openly and continuously growing a carbon nanomaterial, wherein:
the carbon nanomaterial is prepared with a device which comprises:
a metal foil tape feeding system;
a CVD system; and
a collection system all located in open gas;
the metal foil tape feeding system is used for transferring a metal foil tape from the atmosphere to the CVD system;
the CVD system is used for reaction to deposit the carbon nanomaterial;
the metal foil tape with the carbon nanomaterial attached thereto enters the collection system;
the CVD system includes a CVD furnace and a control system in signal connection with the CVD furnace;
a slit coupler is separately coupled with the inlet and the outlet of the CVD furnace in a sealing manner, and axially provided with at least one slit having one end connected with the CVD furnace and the other end open to the atmosphere;
the slits of the two slit couplers correspond to one another and the metal foil tape goes in/out of the CVD furnace via each pair of the slits;
each slit coupler is provided with at least one cooling loop composed of cooling water inlet and outlet pipes in the periphery of the slit, and the cooling water inlet and outlet pipes are provided therein with cooling water for cooling the slit couplers;
each slit coupler is also provided with multiple gas inlet pipes, the end of each gas inlet pipe is connected in a sealing manner to different parts of the CVD furnace, carrier gas and reaction gas required by the CVD system are introduced to different parts of the CVD furnace via the gas inlet pipes, and always maintain a positive pressure or micro positive pressure state in the CVD furnace, and the gas inlet pipes constitute the only passages for supplying the required carrier gas and reaction gas to the CVD furnace;
the slit coupler is further provided with a protection gas injection port connected with the slit;
the protection gas required by the CVD system is directly led into the slit of the slit coupler via the protection gas injection port;
tail gas generated inside the CVD system is discharged via the slits at the two ends, and mixed with the protection gas in the slits before sprayed out from the open ends of the slits; and
the action of spraying the tail gas and the protection gas out of the slits keeps the slits dynamically sealed all the time to avoid air leaking or permeating into the CVD furnace via the slits;
the CVD system is arranged in a ventilation cupboard having its exhaust pipe connected with a tail gas treatment unit, and its exhaust volume much larger than the total amounts of gases discharged from the CVD system; and
the method comprises the steps of:
installing a metal foil tape in the metal foil tape feeding system, continuously conveying it to the CVD system under the conveying action of the metal foil tape feeding system, introducing argon gas or nitrogen gas as carrier gas and protection gas of the CVD furnace into the CVD system according to requirements of different characteristic carbon nanomaterials, as well as hydrogen gas and at least one type of carbon-containing gas as reaction gas of the CVD furnace into the CVD system, while controlling the growth temperature of the CVD furnace to 500-1,200° C.; and
conveying the metal foil tape to the collection system after graphene the carbon nanomaterial is grown on the surfaces of the metal foil tape.

2. The method in claim 1, wherein:
the CVD system is further provided therein with an online quality monitoring feedback device in signal connection with the control system; and
the online quality monitoring feedback device is used for online monitoring the metal foil tape passing through the CVD system deposited with the carbon nanomaterial, and feeding the signal back to the control system, and the control system accordingly controls the growth conditions of the carbon nanomaterial in the CVD furnace.

3. The method in claim 1, wherein:
the control system is provided with a safety monitoring control subsystem, which controls a flow rate of the carrier gas, the reaction gas and the protection gas so as to reduce the concentration of combustible explosive gas discharged from the slits to below its lower explosion limit;
an exhaust pipe of the ventilation cupboard is provided therein with a gas flow sensor in signal connection with the safety monitoring control subsystem to monitor a flow rate of gas discharged from the CVD furnace into the ventilation cupboard; when the gas flow rate inside the ventilation cupboard fails to reach a safety threshold or drops to below the safety threshold during operation, the gas flow sensor sends a signal to the safety monitoring control subsystem, and the safety monitoring control subsystem accordingly enforces cutoff of a heating power supply for the CVD furnace and delivery of the carrier gas and the reaction gas in the gas inlet pipes and gives an alarm;
the CVD system is further provided with a gas concentration sensor in signal connection with the safety monitoring control subsystem to monitor the concentration of combustible explosive gas discharged from the CVD furnace via the slit;
when the gas concentration sensor detects that the concentration of combustible explosive gas is close to a lower explosion limit, it sends a danger-implying signal to the safety monitoring control subsystem, and the safety monitoring control subsystem accordingly enforces cutoff of the combustible explosive gas flow while turning off the heating power supply for the CVD system, and gives an alarm; and
a workshop where the ventilation cupboard is located can be additionally provided with a second gas concentration sensor in signal connection with the safety monitoring control subsystem to monitor the concentrations of combustible explosive gas, oxygen gas and carbon monoxide in the workshop; when the second gas concentration sensor detects that the concentration of combustible explosive gas is close to a lower explosion limit, the concentration of oxygen gas drops to an alarm level or the concentration of carbon monoxide exceeds a standard, it sends a danger-implying signal to the safety monitoring control subsystem, and the safety monitoring control subsystem accordingly enforces cutoff of the combustible explosive gas flow and even the carrier gas and protection gas flow while turning off the heating power supply for the CVD system, and gives an alarm.

4. The method in claim 1, wherein:
the metal foil tape feeding system comprises an unwinding roller for supporting the metal foil tape, drive rollers for driving the metal foil tape to move forward, and guide rollers for adjusting the moving path of the metal foil tape;
the collection system is provided therein with a winding roller for winding and collecting the metal foil tape with the carbon nanomaterial attached thereto and all the rollers are in signal connection with the control system;
the adjacent ones of the unwinding roller, the drive rollers, the guide rollers and the winding roller are mutually asynchronous rollers; and
the metal foil tape is at least provided with a stress sensor, and the unwinding roller, the drive rollers, the guide rollers and the winding roller are provided with a torque sensor; the stress sensor and the torque sensor are in signal connection with the control system, which controls the rotating speeds and the torques of all the rollers based on the signals from the stress sensor and the torque sensor.

5. The method in claim 1, wherein:
the metal foil tape feeding system further comprises a pretreatment system arranged in the moving path of the metal foil tape for cleaning, polishing and coating surface catalyst to the metal foil tape;
the cleaning includes, but not limited to, surface degreasing, impurity removal and oxide removal;
the polishing includes, but not limited to, mechanical polishing, chemical polishing and electrolytic polishing; and
the surface catalyst coating includes, but not limited to, physical coating, chemical coating and electrochemical coating.

6. The method in claim 1, wherein:
the CVD furnace is a high-temperature heating furnace having a closed inlet and outlet;
the high-temperature heating furnace is an integrated furnace having multiple segments under independent control;
each segment of the CVD furnace is at least provided with a temperature sensor in signal connection with the control system; and
the control system controls the temperatures and the heating or cooling rates in the different segments of the CVD furnace based on the signal from the temperature sensor.

7. The method in claim 1, wherein:
the collection system is further provided with a post-treatment system between a second slit coupler and the winding roller.

* * * * *